United States Patent [19]
Shitara

[11] Patent Number: 5,278,996
[45] Date of Patent: Jan. 11, 1994

[54] PORTABLE TRANSCEIVER HAVING CONSUMPTION-CURRENT STABILIZING FUNCTION

[75] Inventor: Katsumi Shitara, Hino, Japan

[73] Assignee: Kabushiki Kaisha Toshiba, Kawasaki, Japan

[21] Appl. No.: 796,838

[22] Filed: Nov. 25, 1991

[30] Foreign Application Priority Data

Nov. 26, 1990 [JP] Japan .................. 2-122452[U]

[51] Int. Cl.⁵ .................. H04B 1/38; H04B 1/034
[52] U.S. Cl. .................. 455/127; 455/89
[58] Field of Search .................. 455/89, 75, 116, 126, 455/127, 125, 129, 289, 82; 330/282, 284, 292, 167; 333/124, 32

[56] References Cited

U.S. PATENT DOCUMENTS

| | | | |
|---|---|---|---|
| 3,766,330 | 10/1973 | Hepp et al. | 369/133 |
| 4,370,622 | 1/1983 | Hornbeck et al. | 455/116 |
| 4,612,669 | 9/1986 | Nossen | 455/129 |
| 5,095,285 | 3/1992 | Khatibzadeh | 333/32 |

Primary Examiner—Reinhard J. Eisenzopf
Assistant Examiner—Nguyen Vo
Attorney, Agent, or Firm—Finnegan, Henderson, Farabow, Garrett & Dunner

[57] ABSTRACT

A portable radio transceiver wherein an isolator which impedance varies usually with the frequency of a communication signal is connected to a power amplifier for power amplification of the communication signal as its load so that, when the frequency of the communication signal is changed through selection of the communication channel, the load impedance of the power amplifier is also changed and correspondingly the consumption current of the power amplifier is changed. In the portable radio transceiver, in order to suppress the change of the consumption current of the power amplifier, an impedance compensation circuit which impedance varies in its direction opposed to the isolator depending on the frequency of the communication signal is separately connected to the power amplifier, whereby changes in the impedance of the load side when viewed from the power amplifier can be substantially cancelled each other.

3 Claims, 3 Drawing Sheets

PORTABLE TRANSCEIVER HAVING CONSUMPTION-CURRENT STABILIZING FUNCTION

BACKGROUND OF THE INVENTION

1. Field of the Invention

The present invention relates to portable transceivers such as cellular type mobile radio telephones which are driven by a battery power source to transmit and receive data on a plurality of channels (a plurality of frequencies) in a radio broadcasting manner and which have a function of stabilizing a consumption current and more particularly, to a portable transceiver which can average the quantities of currents different with respect to used channels and thus can maintain substantially the same power consumption in the battery power source with respect to the different channels even when any of the channels is used.

2. Description of the Related Art

FIG. 6 schematically shows a block diagram of an arrangement of the final stage of a prior art portable radio transceiver. The radio transceiver of FIG. 6 includes a power amplifier 1, an isolator 2, and an antenna 3. In operation, a signal 100 generated as a transmission signal at the previous stage of the transceiver is amplified with respect to power at the power amplifier 1, sent via the isolator 2 to the transmitting antenna 3, and then radiated from the antenna 3 in the form of transmission waves (electromagnetic waves).

Meanwhile it is known that the impedance of the above isolator 2 varies depending on the frequency of its input signal. More specifically, the isolator 2 has such a characteristic that the higher the frequency of the input signal is the larger the capacity is, and conversely the lower the frequency of the input signal is the larger the inductance is. The consumption current of the power amplifier 1 varies with the impedance of a load connected thereto and when the load has a large capacitive impedance, the power amplifier 1 has a small output current and thus requires a small consumption current. Conversely, when the load has a small capacitive impedance or a large inductive impedance, the power amplifier 1 requires its relatively large output current and thus a large consumption current.

Accordingly, in the case where such a portable radio transceiver transmits signals having a plurality of frequencies through channel switching operation:

(a) when the transceiver transmits a signal having a relatively high frequency through corresponding selected one (frequency) of the channels, the isolator 2 connected to the power amplifier 1 as its load has a large capacitive impedance, whereby the consumption current of the power amplifier 1 is suppressed to a low level and therefore the power consumption of the battery power source in the portable radio transceiver can be reduced.

(b) When the radio transceiver transmits a signal having a relatively low frequency, the isolator 2 connected to the power amplifier 1 as its load has a small capacitive impedance or has a large inductive impedance, which results in that the consumption current of the power amplifier 1 becomes large and therefore the battery power source of the portable radio transceiver is quickly and much consumed.

In this way, the consumption current of the power amplifier 1 and thus the power consumption of the battery power source (e.g., Ni-Cd battery) varies depending on the selected channel.

For this reason, in such a portable radio transceiver, generally speaking, it is difficult in actual circumstances to prescribe a standard battery device in its specification. In addition, with respect to differences in the power consumption of the battery power source between the use channels, the power consumption of the battery power source when one of the channels having a higher frequency is selected can be maintained or sustained for a relatively long; whereas, when one of the channels having a lower frequency is frequently selected, the power of the battery power source can be consumed unexpectedly quickly, thus causing an undesirable communication failure and a user to be confused.

SUMMARY OF THE INVENTION

In view of such circumstances, it is an object of the present invention to provide a portable ratio transceiver having a consumption-current stabilizing function which can average quantities of consumption currents of a battery power source different depending on the selected channel (frequency) and thus can make substantially constant the power consumption of the battery power source between different channels to be selected even when the transceiver is selected at any one of the channels.

In accordance with an aspect of the present invention, in order to attain the above object, as mentioned above, a load which impedance varies with the frequency of an input signal of a power amplifier is connected to the power amplifier, and a compensation circuit for cancelling and compensating for the impedance change of the load is also connected to the power amplifier, so that the compensation of the load impedance through the compensation circuit enables the consumption current of the power amplifier to be kept substantially constant regardless of changes in the impedance of the load itself.

The compensation circuit may comprise, for example, control voltage generation means for outputting a high control voltage when a high frequency is selected and for outputting a low control voltage when a low frequency is selected according to the channel frequency, and a vari-cap diode (voltage variable capacitance diode) which impedance varies to have an decreased capacitive impedance when subjected to an application of the high control voltage generated from the control voltage generation means and to have an increased capacitive impedance when subjected to an application of the low control voltage thereof according to the control voltage applied thereto.

In the case where such a compensation circuit having the aforementioned arrangement and function as the above is provided to the load side of the power amplifier, even when the selected channel frequency is high or low, the impedance of the power amplifier when viewed from the power amplifier, i.e., a combined impedance of the load such as the isolator and the compensation circuit can be kept substantially constant, which results in that the current consumption of the power amplifier can be also kept at a substantially constant rate regardless of the selected channel. Of course, this means that the power consumption of the battery power source for supplying power to the power amplifier, compensation circuit, etc. of the portable radio transceiver can be maintained substantially constant independently of the selected channel.

As a result, such problems in the prior art portable radio transceiver that "it is difficult to prescribe a standard battery drive time in its specification" and that "the power consumption of the battery power source varies depending on the selected channel" which causes a user to be confused can be satisfactorily eliminated.

DESCRIPTION OF THE PREFERRED EMBODIMENTS

Figure 1:
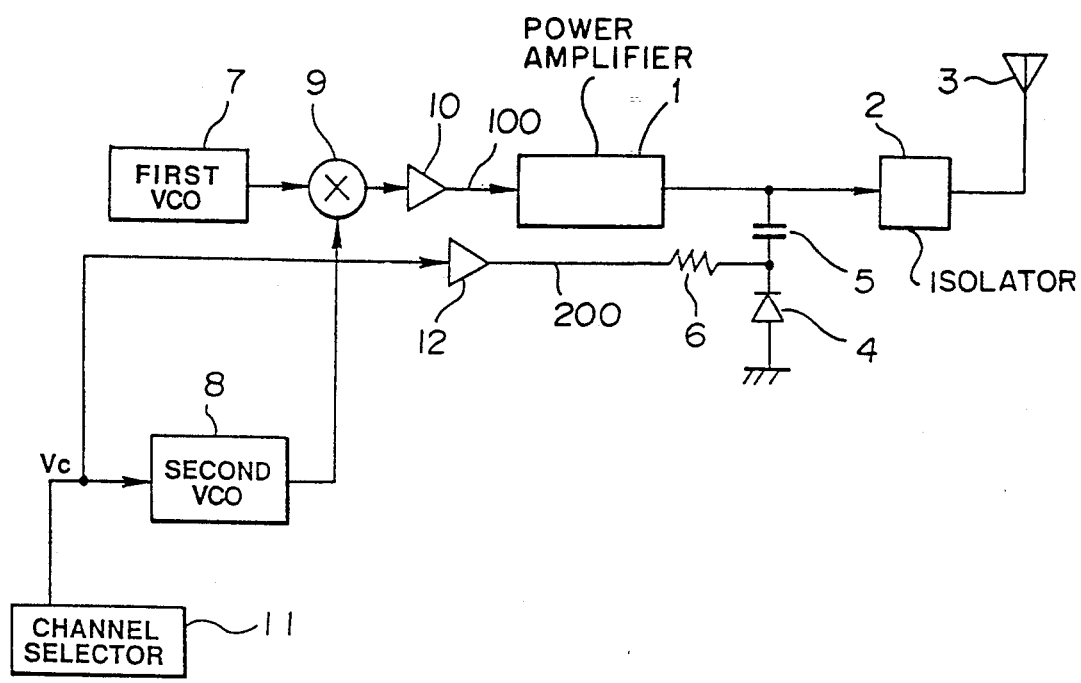
FIG. 1 is a block diagram of an arrangement of a portable radio transceiver having a consumption-current stabilizing function in accordance with an embodiment of the present invention.

Referring first to FIG. 1, there is shown an embodiment of a portable radio transceiver having a consumption-current stabilizing function in accordance with an embodiment of the present invention. Even in FIG. 1, only the final stage of the portable radio transceiver is illustrated for convenience of explanation.

The portable radio transceiver of the embodiment of FIG. 1 includes a power amplifier 1 for amplifying a transmission signal with respect to power, an isolator 2 which passes the transmission signal power-amplified at the power amplifier 1 in its only-one direction, an antenna 3 for radiating the transmission signal passed through the isolator 2 therefrom in the form of transmission waves, a vari-cap diode (voltage variable capacitance diode) 4 which capacitance varies with a voltage applied thereto, a capacitor 5 which is used to adjust the capacitance of an overall load including the isolator 2 and the vari-cap diode 4 when viewed from the power amplifier 1 and to connect the vari-cap diode 4 to a load side of the power amplifier 1 while the voltage applied to the vari-cap diode 4 does not affect the output of the power amplifier 1, a resistor 6 through which a voltage 200 is applied to the vari-cap diode 4 as its control voltage, a first voltage-controlled oscillator (first VCO) 7 for modulation, a second voltage-controlled oscillator (second VCO) 8 for determination of the frequency of the transmission signal, a mixer 9 for mixing an oscillation signal of the first VCO 7 and an oscillation signal of the second VCO 8, a buffer amplifier 10 for inputting a transmission output signal of the mixer 9 to the power amplifier 1, a channel selector 11 for generating various sorts of control voltages Vc to selectively switch the oscillation frequency (i.e., channel frequency) of the second VCO 8 in response to user's selecting operation, and a buffer amplifier 12 for applying the control voltage Vc generated at the channel selector 11 to the vari-cap diode 4 as the aforementioned control voltage 200.

In the present embodiment, the control voltage Vc for channel frequency selection generated from the channel selector 11 is also used as the capacitance control voltage 200 of the vari-cap diode 4.

Figure 2:
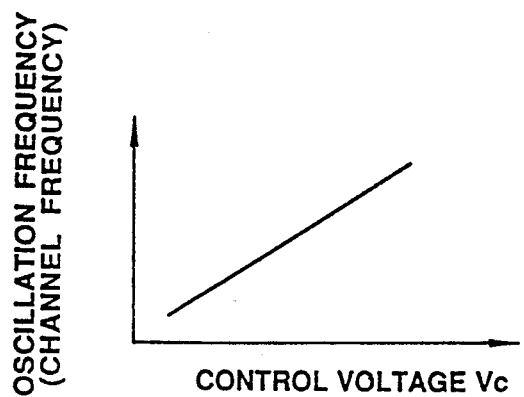
FIG. 2 is a graph showing control voltage/oscillation frequency characteristics of a second voltage-controlled oscillator shown in FIG. 1.

In the illustrated example, the control voltage Vc as well as the oscillation frequency (channel frequency) of the second VCO 8 controlled by the control voltage satisfy such a relationship as shown in FIG. 2. More in detail, as shown in FIG. 2, the oscillation frequency of the second VCO 8 increases in proportion to the value of the control voltage Vc. In other words, when the aforementioned transmission signal has a low channel frequency, the control voltage Vc is set low so that the voltage 200 to be applied to the vari-cap diode 4 as its capacitance control voltage is also set low. Conversely, when the transmission signal has a high channel frequency, the control voltage Vc is set high so that the voltage 200 to be applied to the vari-cap diode 4 as its capacitance control voltage is also set high. This will be appreciated from FIG. 2.

Meanwhile, the vari-cap diode 4 has such a characteristic that the capacitance of the vari-cap diode 4 is decreased as the capacitance control voltage 200 increases, while, the capacitance is increased as the control voltage 200 decreases. That is, the vari-cap diode 4 has such a characteristic showing a relationship between the control voltage 200 and the capacitance of the vari-cap diode 4 as shown in FIG. 3.

Figure 3:
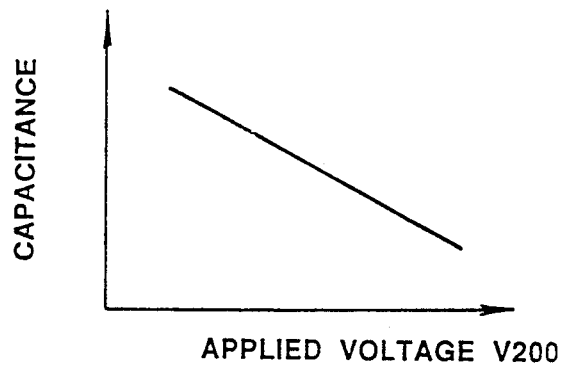
FIG. 3 is a graph showing applied voltage/capacitance characteristics of a vari-cap diode (variable capacitance diode) shown in FIG. 1.
Figure 6:
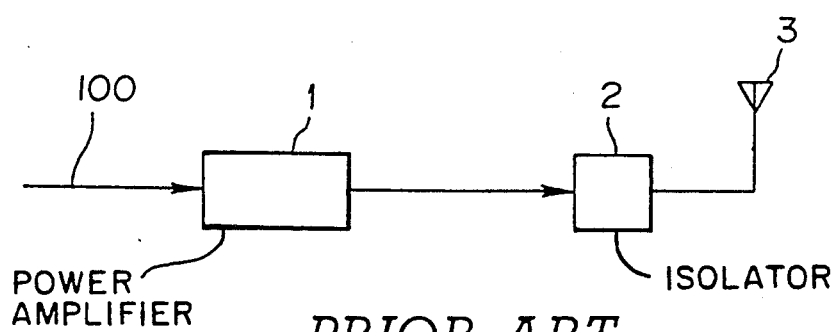
FIG. 6 is a block diagram of an arrangement of the final stage of a prior art portable radio transceiver.

Accordingly, it will be seen from FIGS. 2 and 3 that:

(1) When the channel frequency of the transmission signal is low, the control voltage 200 is also low and thus the capacitance of the vari-cap diode 4 increases.

(2) When the channel frequency of the transmission signal is high, the control voltage 200 is also high and thus the capacitance of the vari-cap diode 4 decreases.

Figure 4:
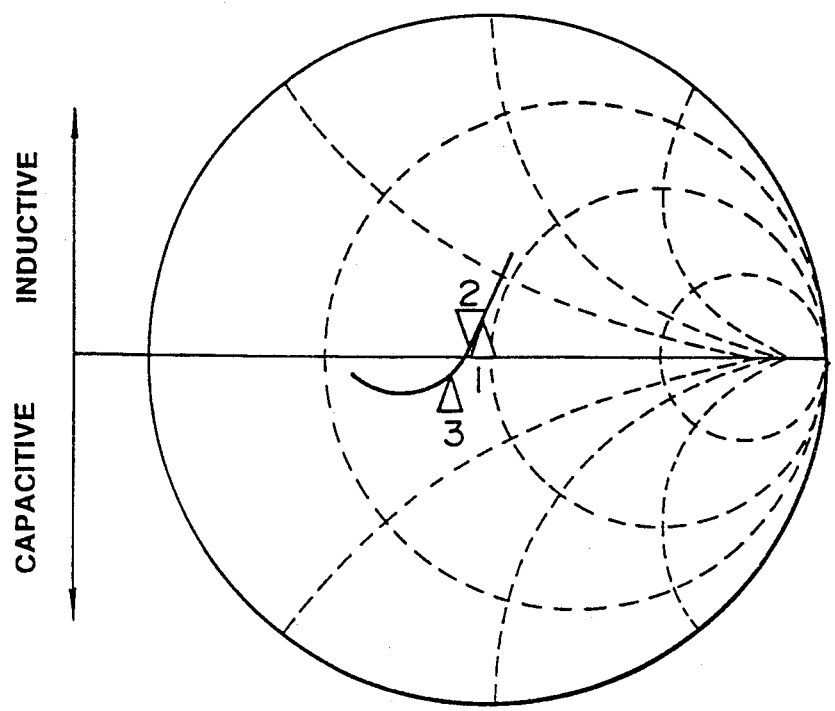
FIG. 4 is a Smith chart showing an impedance characteristic of an isolator shown in FIG. 1.

As already explained earlier, the isolator 2 has such an impedance characteristic that when the frequency of the input signal is high, the impedance of the isolator becomes capacitive, whereas, when the signal frequency is low, the impedance of the isolator becomes inductive. The characteristic of the isolator 2 is shown by a Smith chart in FIG. 4. In the drawing, a marker 1 denotes a signal which passes through the isolator 2, that is, a part of the transmission signal at which the frequency of the transmission signal is a minimum in its frequency band; while a marker 3 denotes a part of the transmission signal at which the frequency of the transmission signal is a maximum in the frequency band. It will be understood from the Smith chart that the isolator 2 has such a characteristic that the lower the frequency of the signal passing through the isolator is the larger the inductance is, whereas, the higher the signal frequency is the larger the capacitance is. In FIG. 4, a maker 2 denotes a center frequency in the aforementioned frequency band.

Figure 5:
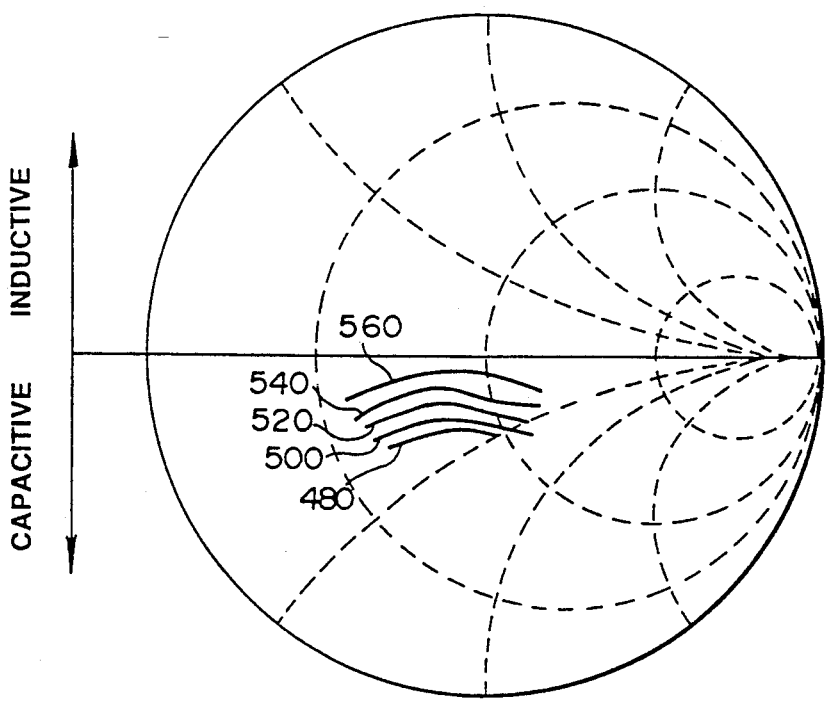
FIG. 5 is a current contour line diagram showing variations in a consumption current with respect to variations in the load impedance of a power amplifier shown in FIG. 1.

As already explained earlier, the consumption current of the power amplifier 1 varies depending on the impedance of a load connected to the power amplifier 1. Such consumption current variation is shown in FIG. 5 in the form of a current contour line diagram. From FIG. 5, it will be appreciated that when the capacitive property of the load is stronger, the consumption current tends to decrease, whereas, when the capacitive property of the load is weaker or the inductive property thereof is stronger, the consumption current tends to increase. Numeral values in FIG. 5 denote exemplary values of the consumption current in the power amplifier 1 and the same value is shown as a contour line.

Explanation will next be made as to the operation of the present embodiment, taking into consideration such characteristics of the vari-cap diode 4, isolator 2 and power amplifier 1 as mentioned above.

When the portable radio transceiver is started, this causes power to be supplied from a battery power source (not shown) to such active elements in FIG. 1 as the power amplifier 1, first and second VCOs 7 and 8, buffer amplifiers 10 and 12, and channel selector 11.

Now when the first VCO 7 generates a signal modulated with data to be transmitted, the generated signal is applied from the first VCO 7 to one input end of the mixer 9. On the other hand, the second VCO 8 generates a signal having a frequency corresponding to the control voltage Vc applied from the channel selector 11 and the generated signal is applied from the second VCO 8 to the other input end of the mixer 9.

The output signals of the first and second VCOs 7 and 8 are mixed in the mixer 9 into a transmission signal having a predetermined channel frequency. Of course, the predetermined channel frequency corresponds to the frequency of the channel designated by the user through the channel selector 11.

The thus-generated transmission signal is sent through the buffer amplifier 10 to the power amplifier 1, where the transmission signal is amplified to a predetermined power level and then sent to the isolator 2. The signal sent to the isolator 2 is further sent to the antenna 3, from which the signal is radiated in the form of electromagnetic waves, as already explained above.

Even in the present embodiment, as stated above, the control voltage Vc for switching of the channel frequency generated at the channel selector 11 is also used as the capacitance control voltage 200 of the vari-cap diode 4, and the output frequency of the second VCO 8, i.e., the control voltage Vc controlling the channel frequency is also applied to the vari-cap diode 4 as its capacitance control voltage 200 through the buffer amplifier 12 and the resistor 6.

It will be clear from the arrangement of FIG. 1 that the vari-cap diode 4 is connected through the capacitor 5 to the output of the power amplifier 1 as a second load of the power amplifier 1. That is, in the present embodiment, the load of the power amplifier 1 is made up of the isolator 2, vari-cap diode 4 and capacitor 5.

And, as already explained above in conjunction with FIGS. 2 and 3:

(1) When the channel frequency of the transmission signal is low, the control voltage 200 is also low and the capacitance of the vari-cap diode 4 increases.

(2) When the channel frequency of the transmission signal is high, the control voltage 200 is also high and the capacitance of the vari-cap diode 4 decreases.

As a result, the combination impedance of the aforementioned load when viewed from the power amplifier 1 is determined not only by the impedance characteristic (refer to FIG. 4) of the isolator 2 itself based on the frequency of the transmission signal but also by the capacitance of the vari-cap diode 4 controlled by the control voltage 200 (control voltage Vc).

This results in:

(A) When the selected channel frequency is low, that is, when the frequency of the transmission signal is low, the impedance of the isolator 2 itself varies in its smaller capacitive direction or in its larger inductive direction. At this time, the control voltage 200 is low and the capacitance of the vari-cap diode 4 increases, which results in that the combined load impedance is kept at a substantially averaged value because variations in the load impedances are cancelled each other.

(B) When the selected channel frequency is high, that is, when the frequency of the transmission signal is high, the impedance of the isolator 2 itself varies in its larger capacitive direction. At this time, the control voltage 200 is high and the capacitance of the vari-cap diode 4 decreases, which results, even in this case, in that the combined load impedance is kept at a substantially averaged value because variations in the load impedances are cancelled each other.

Such a phenomenon as mentioned above takes place at the load side of the power amplifier 1. Thus, even when such a channel frequency as mentioned above is selected or an intermediate frequency channel therebetween is selected, a variation in the load impedance when viewed from the power amplifier 1 can be satisfactorily suppressed. For this reason, fluctuations in the consumption current of the power amplifier 1 caused by the different transmission frequencies, which would occur in the prior art, can be suppressed so that it can be prevented that the power consumption of the battery power source varies depending on the selected channel frequency.

In this way, in accordance with the present invention, the control voltage Vc of the second VCO 8 for channel selection is applied to the vari-cap diode 4 as the capacitance control voltage 200 and the vari-cap diode 4 is set to have such a characteristic as opposed to the impedance characteristic of the isolator 2 itself to thereby compensate for variations in the impedance of the isolator 2. As a result, variations in the consumption current of the power amplifier 1 can be suppressed and thus the power consumption of the battery power source can be substantially constant without being affected by the selected channel frequency.

Although the compensation of the impedance variation of the isolator 2 can be realized basically by the capacitance variation of the vari-cap diode 4 itself in the circuit of the present invention, the degree of its compensation and how to compensate for it can be optimized by selecting the capacitance value of the capacitor 5 and the resistance value of the resistor 6.

Further, the control voltage Vc for channel frequency selection generated from the channel selector 11 has been also used as the capacitance control voltage 200 of the vari-cap diode 4 in the present embodiment, but as means for generating the capacitance control voltage 200 of the vari-cap diode 4, such a microcomputer that recognizes the then-selected channel and controls the generation of a voltage corresponding thereto may be suitably employed, for example.

Also, though the isolator has been used as a load which impedance varies with the frequency of the transmission signal in the foregoing embodiment, the present invention is not limited to the specific isolator as the load. That is, in accordance with the present invention, a variation in the impedance of any load exhibiting substantially the same impedance characteristic as mentioned above can be compensated for and thus fluctuations in the consumption current of the corresponding power amplifier can be suppressed.

What is claimed is:

1. A portable radio transceiver having a consumption-current stabilizing function which is driven by a battery power source to perform data radio communication with use of a plurality of frequencies, said transceiver comprising:

a power amplifier for receiving a communication signal for said data radio communication and amplifying said received communication signal;

a load having an impedance, said load connected to an output of said power amplifier and said impedance varies to have an increased capacitive impedance when a frequency of said communication signal power-amplified by said power amplifier increases and to have an increased inductive impedance when the frequency of said power-amplified communication signal decreases; and an impedance compensation circuit connected to the output of said power amplifier, said impedance compensation circuit including voltage generation means for generating a first voltage when the frequency of said communication signal is at a first level and generating a second voltage when the frequency of the communication signal is at a second level, said first voltage being higher than said second voltage and said first level being higher than said second level, and a voltage variable capacitance diode to which said first and second voltages are applied as its control voltage and a capacitance of said voltage variable capacitance diode decreases when said first voltage is generated and increases when said second voltage is generated.

2. A portable radio transceiver having a consumption-current stabilizing function as set forth in claim 1, wherein the frequency of said communication signal is determined when said communication signal is mixed with an output oscillation signal of a synthesizing voltage control oscillator, and said voltage generation means applies a frequency control voltage to said voltage control oscillator and also to said variable capacitance diode to generate the control voltage of said variable capacitance diode.

3. A portable radio transceiver having a consumption-current stabilizing function as set forth in claim 1, wherein said load is an isolator which passes therethrough said communication signal power-amplified by said power amplifier in one direction.

* * * * *